United States Patent
Cooke

(10) Patent No.: US 7,797,595 B2
(45) Date of Patent: Sep. 14, 2010

(54) SERIALLY DECODED DIGITAL DEVICE TESTING

(75) Inventor: Laurence H. Cooke, Aptos, CA (US)

(73) Assignee: On-Chip Technologies, Inc., Aptos, CA (US)

(*) Notice: Subject to any disclaimer, the term of this patent is extended or adjusted under 35 U.S.C. 154(b) by 295 days.

(21) Appl. No.: 12/141,284

(22) Filed: Jun. 18, 2008

(65) Prior Publication Data

US 2009/0316506 A1  Dec. 24, 2009

(51) Int. Cl.
*G11C 29/00* (2006.01)
(52) U.S. Cl. ...................... 714/719; 714/743
(58) Field of Classification Search ............ 365/189.02, 365/230.05, 230.06, 221; 341/110; 714/718, 714/719, 743
See application file for complete search history.

(56) References Cited

U.S. PATENT DOCUMENTS

| | | | | | |
|---|---|---|---|---|---|
| 5,311,468 A | * | 5/1994 | Anderson | .............. | 365/189.02 |
| 5,406,527 A | * | 4/1995 | Honma | ................... | 365/230.05 |
| 5,566,124 A | * | 10/1996 | Fudeyasu et al. | ....... | 365/230.06 |
| 5,946,256 A | * | 8/1999 | Okimura | ..................... | 365/221 |
| 5,996,097 A | | 11/1999 | Evans | | |
| 6,812,874 B1 | * | 11/2004 | Johnson | ...................... | 341/110 |
| 2007/0050596 A1 | | 3/2007 | Cooke | | |

* cited by examiner

*Primary Examiner*—David Ton
(74) *Attorney, Agent, or Firm*—Connolly Bove Lodge & Hutz LLP

(57) ABSTRACT

Testing of memories that decode a serial stream of address data to access the memory may be performed by either successively halving the number of selected word lines as each address bit is acquired, until a single word line is selected, or by rotating the selection bits in its shift register to select a new set of address lines. As such, a combination of incomplete addressing and rotation can efficiently test large memories by reading and/or writing groups of words. Similar techniques may also be applied to non-memory devices.

14 Claims, 7 Drawing Sheets

SERIALLY DECODED DIGITAL DEVICE TESTING

FIELD OF THE INVENTION

The present invention pertains to testing memories that decode a serial stream of address data to access the memories with either parallel or serial output. Other embodiments may apply similar techniques to the testing of devices other than memories.

BACKGROUND OF THE INVENTION

Evans, in U.S. Pat. No. 5,996,097, granted Nov. 30, 1999, teaches a technique for efficiently testing a memory or an array of logic configured as an addressed array by simultaneously selecting all the addresses, simultaneously writing patterns into the selected memory or logic, and simultaneously reading and comparing each of the multiple results with the desired outcomes. Evans correctly points out that this technique can significantly reduce the test time required to test such a structure, which in turn would significantly reduce the cost of the product since the cost of testing a complex semiconductor product is a significant portion of the cost of producing such products. Still, selecting all of the address lines in a traditional memory is not desirable since different states must be stored into adjacent bits of the memory in order to test for shorts between the bits. Furthermore, Evans' approach requires comparison logic at each of the selected addresses to compare the results with the desired outcomes, which while readily available in a content addressable memory that Evans used as an example, it is not readily available in a standard memory.

This inventor has disclosed a serial decoding technique in US Published Application Number 2007/0050596, published on Mar. 1, 2007, that successively halves the number of selected word lines as each address bit is acquired until, on acquiring the last address bit, a single word line is selected. Because the structure is a circular shift register, at any point in this serial address generation cycle, the structure can alternatively rotate the selection bits in its shift register to select a new set of address lines. In that application the inventor also disclosed a way to improve the access of a memory with serial output when the last two possible values from the selected memory outputs contain the same data.

The serial shift register decoder as shown in FIG. 1 is comprised of a single bit address input; a multiplicity of shift register stages, each with a word line output, where each of the shift register stages is connected to a previous and a next shift register stage such that the data shifts through the shift register stages in a circular fashion, the input of half of the register stages is the AND of the said address input and the previous shift register stage, and the input of the other half of the shift register stages is the AND of the inverse of the address input and the previous shift register stage. The word lines in FIG. 1 each correspond to a unique address between 0 and 15 and are sorted, by wiring, into sequential order. Table 1 below shows the relationship between the bit locations and their addresses for 2, 3 and 4 bit decodes.

TABLE 1

| | Shift Bit # | | | | | | | | | | | | | | | | |
|---|---|---|---|---|---|---|---|---|---|---|---|---|---|---|---|---|---|
| | 0 | 1 | 2 | 3 | 4 | 5 | 6 | 7 | 8 | 9 | 10 | 11 | 12 | 13 | 14 | 15 | |
| Polarity | − | + | + | + | + | − | + | + | − | − | + | − | + | − | − | − | 4 bit |
| Address | 0 | 1 | 3 | 7 | 15 | 14 | 13 | 11 | 6 | 12 | 9 | 2 | 5 | 10 | 4 | 8 | Decode |
| Polarity | − | + | + | + | − | + | − | − | 3 bit | | | | | | | | |
| Address | 0 | 1 | 3 | 7 | 6 | 5 | 2 | 4 | Decode | | | | | | | | |
| Polarity | − | + | + | − | 2 bit | | | | | | | | | | | | |
| Address | 0 | 1 | 3 | 2 | Decode | | | | | | | | | | | | |

Still, while the advantages of serially addressing a memory in today's high speed communications technology was discussed in the disclosure of the aforementioned application, the advantages of testing memories with such a decode structure was not discussed. Furthermore, while a technique was previously presented to improve the latency of the memory by one clock cycle when selecting between outputs, this disclosure extends the capability with new techniques.

SUMMARY OF EMBODIMENTS OF THE INVENTION

This disclosure describes a method that may be used to efficiently test a large serially addressed memory, by utilizing the features of a serial shift register decoder.

Specifically it describes a method for testing a memory, addressed using a serial decoder, which may comprise:
a) Simultaneously writing into all of the words in said memory,
b) Simultaneously writing into half of said words in said memory,
c) Simultaneously reading half of said words in said memory, and
d) Simultaneously reading the words in said memory not read in step c, where the half of the words in step b are either the even words or the odd words, and half the selected words in step c not the same as the selected words in step b.

The words in step a may be selected by resetting the serial decoder, the words in step b may be selected by partially addressing the serial decoder, the words in step c may be selected by rotating the decoded address within the serial decoder, and the words in step d may be selected by resetting, partially addressing and rotating the decoded address within the serial decoder.

Reading may include simultaneously checking that the voltage levels of all outputs of the selected words in the memory are between two reference voltages, which may be determined by the state of a test input.

This disclosure further describes an integrated circuit memory that may comprise: a serial address decoder; a memory core; and output logic; where the output logic may detect and output both an output value from the at least one selected word in the memory core and a bit test output signifying the validity of said output value. The bit test output in a normal mode may be invalid when the output value is in a mid-voltage range and in a test mode may be valid in a different mid-voltage range.

This disclosure also describes an integrated circuit memory where the output logic may serially output the values of successive outputs as soon as the outputs are valid, by serially outputting the results of a memory access as soon as the differences between the contents of the remaining possible alternative addresses in memory can be resolved.

Also described is the application of similar techniques to more general devices, which may be other than memories.

BRIEF DESCRIPTION OF THE DRAWINGS

The invention will now be described in connection with the attached drawings, in which.

DESCRIPTION OF VARIOUS EMBODIMENTS

Figure 1:
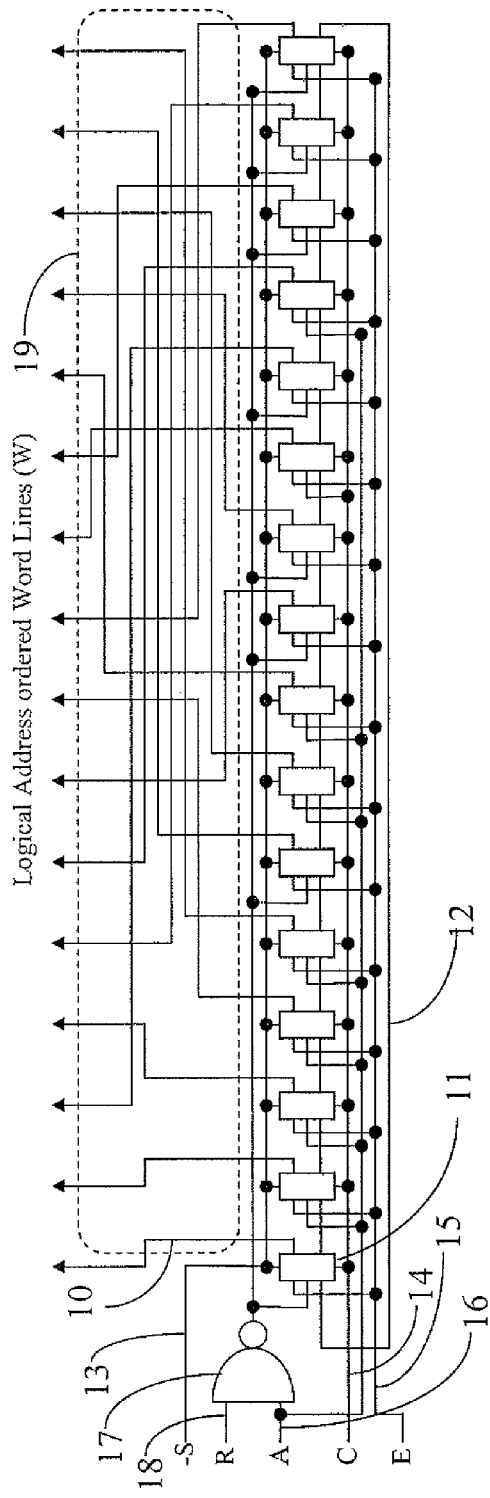
FIG. 1 is a diagram of a serial circular shift register decoder.

Reference is made to FIG. 1, a diagram of a serial circular shift register decoder. In this example, the shift register is shown having 16 storage elements 11, and the data out from the last element 12 is shown driving into the first element in a circular fashion. Each of the 16 word lines 10 may be driven by a stage 11 of the shift register. A −S line 13, Clock line 14, and Enable line 15 may drive into all stages of the shift register. An Address line 16 may drive half of the stages in the shift register, and a NAND gate 17, driven by the Address line 16 and a separate R line 18 may drive the other half of the stages. The actual addresses of the word lines may be out of order, as shown in Table 1 above, which may necessitate a reordering of the word lines 19 to put them in order from address 0 to address 15.

Figure 2:
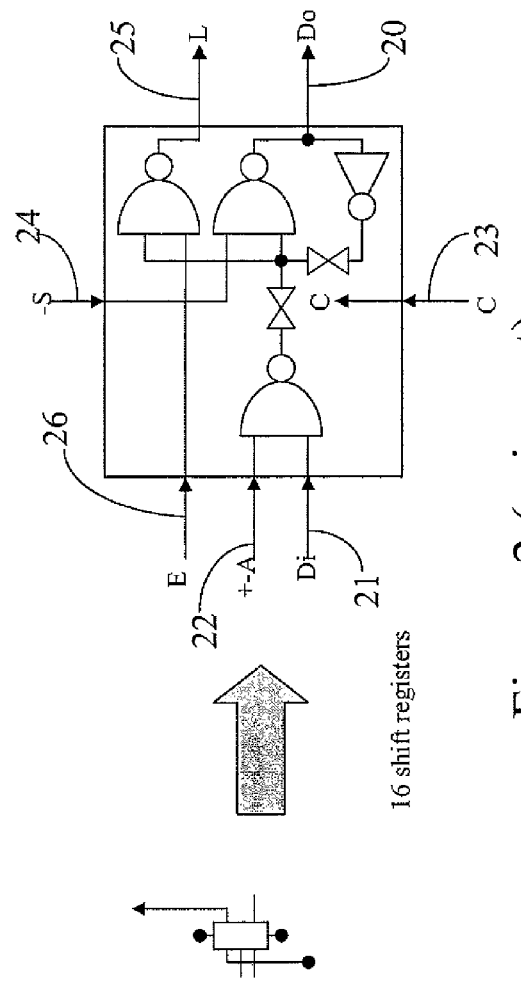
FIG. 2 is a diagram of the logic in each stage of the serial decoder.

Reference is now made to FIG. 2, which shows the detailed logic of a single stage of an exemplary shift register decoder. The value in each stage of the shift register may be driven out the Do line 20, which may be connected to the Di line 21 of the next stage of the register. Prior to loading the first address bit, all storage elements may be set when the −S line 24 goes low. Subsequently, loading each address bit may correspond with clocking the shift register one location. The value on the Di line 21, which may be from a previous stage, may be gated with the current address bit 22 (A) or its inverse (−A), and may then be captured in the current stage when the clock 23 is high. The word lines 25 may be enabled when an enable signal 26 goes high after the last address bit is loaded. Returning to FIG. 1, the serial decoder's address input is shown driving 8 loads, and the NAND gate is shown driving 8 loads.

Figure 3:
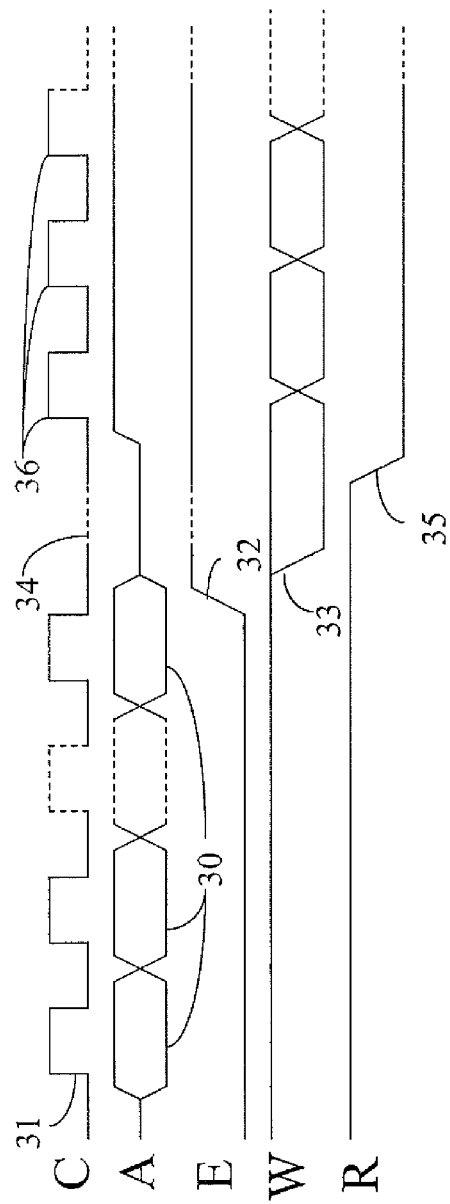
FIG. 3 is a timing diagram of the serial decoder.

Reference is now made to FIG. 3, an exemplary timing diagram of a decode structure as shown in FIG. 1. Prior to loading an address, the Set line (−S) may generally be pulled low to reset the entire shift register. Then each successive Address value (A) 30 may be changed prior to the rising edge of the Clock (C) 31, which may then capture them into the shift register. After the last Address bit is loaded, the enable line (E) may be brought high 32, which may then enable the Word lines (W) 33 to select the word being read or written, in which, when requiring more than one clock cycle, the clock may be turned off 34 during the actual memory access operation. In this timing diagram, following the initial memory operation the Rotate control (R) is shown as being set low 35. Thereafter, each successive Clock (C) 36 may cause the shift register to circulate its contents one stage.

Table 2 below shows the ordered word line values after each clock cycle of two address decode operations, according to some exemplary operations.

TABLE 2

| Address | | | | Serial Decoding |
|---|---|---|---|---|
| | | | | Ordered Word Lines |

| Operation | A | S | R | 0 | 1 | 2 | 3 | 4 | 5 | 6 | 7 | 8 | 9 | 10 | 11 | 12 | 13 | 14 | 15 |
|---|---|---|---|---|---|---|---|---|---|---|---|---|---|---|---|---|---|---|---|
| Reset   | x | 1 | x | 1 | 1 | 1 | 1 | 1 | 1 | 1 | 1 | 1 | 1 | 1 | 1 | 1 | 1 | 1 | 1 |
| A: xxx0 | 0 | 0 | 1 | 1 | 0 | 1 | 0 | 1 | 0 | 1 | 0 | 1 | 0 | 1 | 0 | 1 | 0 | 1 | 0 |
| A: xx00 | 0 | 0 | 1 | 1 | 0 | 0 | 0 | 1 | 0 | 0 | 0 | 1 | 0 | 0 | 0 | 1 | 0 | 0 | 0 |
| A: x000 | 0 | 0 | 1 | 1 | 0 | 0 | 0 | 0 | 0 | 0 | 0 | 1 | 0 | 0 | 0 | 0 | 0 | 0 | 0 |
| A: 0000 | 0 | 0 | 1 | 1 | 0 | 0 | 0 | 0 | 0 | 0 | 0 | 0 | 0 | 0 | 0 | 0 | 0 | 0 | 0 |
| Reset   | x | 1 | x | 1 | 1 | 1 | 1 | 1 | 1 | 1 | 1 | 1 | 1 | 1 | 1 | 1 | 1 | 1 | 1 |
| A: xxx1 | 1 | 0 | 1 | 0 | 1 | 0 | 1 | 0 | 1 | 0 | 1 | 0 | 1 | 0 | 1 | 0 | 1 | 0 | 1 |
| A: xx11 | 1 | 0 | 1 | 0 | 0 | 0 | 1 | 0 | 0 | 0 | 1 | 0 | 0 | 0 | 1 | 0 | 0 | 0 | 1 |
| A: x111 | 1 | 0 | 1 | 0 | 0 | 0 | 0 | 0 | 0 | 0 | 1 | 0 | 0 | 0 | 0 | 0 | 0 | 0 | 1 |
| A: 1111 | 1 | 0 | 1 | 0 | 0 | 0 | 0 | 0 | 0 | 0 | 0 | 0 | 0 | 0 | 0 | 0 | 0 | 0 | 1 |

As can be seen in Table 2 above, the reset may select all word lines, and each successive address bit may then select half of the remaining word lines, based on the value of the address bit, least-order bit first, in the embodiment represented in Table 2. Rotation may occur when the R input (column 4 of the table) is set to a 0 value. A Rotation following partial addressing may be used to combine the remaining selected word lines as if a don't-care had been shifted into the least-order bit position of the address, as can be seen in the 0xxx and 1xxx examples in Table 3 below.

TABLE 3

Serial Decoding and Rotation

| Address Operation | A | S | R | 0 | 1 | 2 | 3 | 4 | 5 | 6 | 7 | 8 | 9 | 10 | 11 | 12 | 13 | 14 | 15 |
|---|---|---|---|---|---|---|---|---|---|---|---|---|---|---|---|---|---|---|---|
| Reset | x | 1 | x | 1 | 1 | 1 | 1 | 1 | 1 | 1 | 1 | 1 | 1 | 1 | 1 | 1 | 1 | 1 | 1 |
| A: xxx0 | 0 | 0 | 1 | 1 | 0 | 1 | 0 | 1 | 0 | 1 | 0 | 1 | 0 | 1 | 0 | 1 | 0 | 1 | 0 |
| A: xx0x | X | 0 | 0 | 1 | 1 | 0 | 0 | 1 | 1 | 0 | 0 | 1 | 1 | 0 | 0 | 1 | 1 | 0 | 0 |
| A: x0xx | X | 0 | 0 | 1 | 1 | 1 | 1 | 0 | 0 | 0 | 0 | 1 | 1 | 1 | 1 | 0 | 0 | 0 | 0 |
| A: 0xxx | X | 0 | 0 | 1 | 1 | 1 | 1 | 1 | 1 | 1 | 1 | 0 | 0 | 0 | 0 | 0 | 0 | 0 | 0 |
| Reset | X | 1 | x | 1 | 1 | 1 | 1 | 1 | 1 | 1 | 1 | 1 | 1 | 1 | 1 | 1 | 1 | 1 | 1 |
| A: xxx1 | 1 | 0 | 1 | 0 | 1 | 0 | 1 | 0 | 1 | 0 | 1 | 0 | 1 | 0 | 1 | 0 | 1 | 0 | 1 |
| A: xx1x | X | 0 | 0 | 0 | 0 | 1 | 1 | 0 | 0 | 1 | 1 | 0 | 0 | 1 | 1 | 0 | 0 | 1 | 1 |
| A: x1xx | X | 0 | 0 | 0 | 0 | 0 | 0 | 1 | 1 | 1 | 1 | 0 | 0 | 0 | 0 | 1 | 1 | 1 | 1 |
| A: 1xxx | X | 0 | 0 | 0 | 0 | 0 | 0 | 0 | 0 | 0 | 0 | 1 | 1 | 1 | 1 | 1 | 1 | 1 | 1 |

In both of the cases shown in Table 3, one address bit was entered after the reset, selecting half of the word lines. Thereafter, 3 cycles of Rotation shifted the selected bits to the upper or lower half of the address space, which is equivalent to all addresses with either a 0 or 1 in the most significant position. With the addition of a small amount of test logic, such word line manipulation may be used to rapidly test the memory it is associated with.

A common memory test called the checkerboard consists of writing each word of memory with alternating 0s and 1s, creating a checkerboard pattern, where each bit's adjacent bits, above, below, left and right of the bit, contains a state opposite to the bit's state, and reading each word back again. For a memory with N words this takes at least 2N write and read cycles. Using partial decode and rotation, the entire memory may be set to a 0101 . . . pattern following reset, and half the entries (either odd or even) may be set to a 1010 . . . pattern after loading the first address bit into the serial decoder. Thereafter, a reset may be used to select all the words in memory, half of those set to a logical 1 and half set to a logical 0. Then, with the proper configuration of memory, a read may select the entire memory and output a mid-voltage between logical 0 and 1, which if it were possible to properly detect, would be equivalent to separately reading each of the N words. In this fashion, it is theoretically possible to perform a checkerboard test in 3 cycles, as opposed to 2N cycles. Practically, the difference between a good memory and one with a single bit stuck high or low, may be too difficult to detect for memories larger than 1024, requiring successive reads of groups of words, requiring rotation of the serial decoder.

In an embodiment of the present invention, partial address decoding and partially decoded address rotation of a serially address decoded digital memory may be used in conjunction with test logic to efficiently test the memory, by performing groups of memory writes and reads, each of which may be used to simultaneously select multiple words in the memory.

Figure 4:
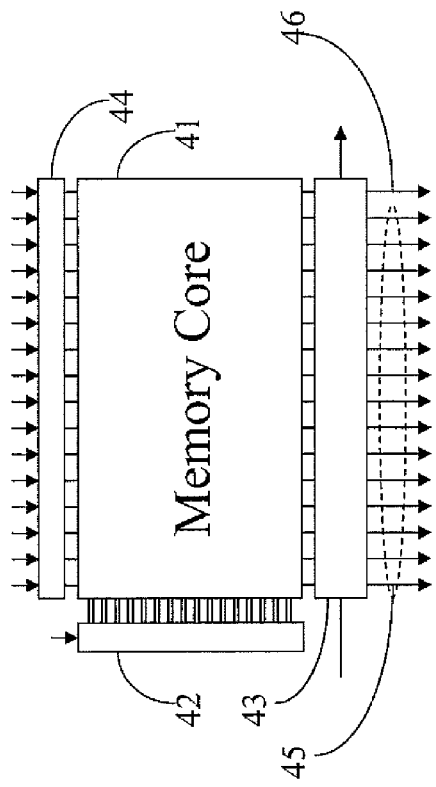
FIG. 4 is a diagram of a serial address decoded memory.

Reference is now made to FIG. 4, a diagram of a serial address decoded memory. The memory may include a serial decoder 42, a memory core 41, input drive logic 44 and output logic 43. In this embodiment of a digital memory, the word lines from the serial decoder are shown as being gated by a read/write control line, creating two word lines for each row: one for read, and one for write.

Figure 5:
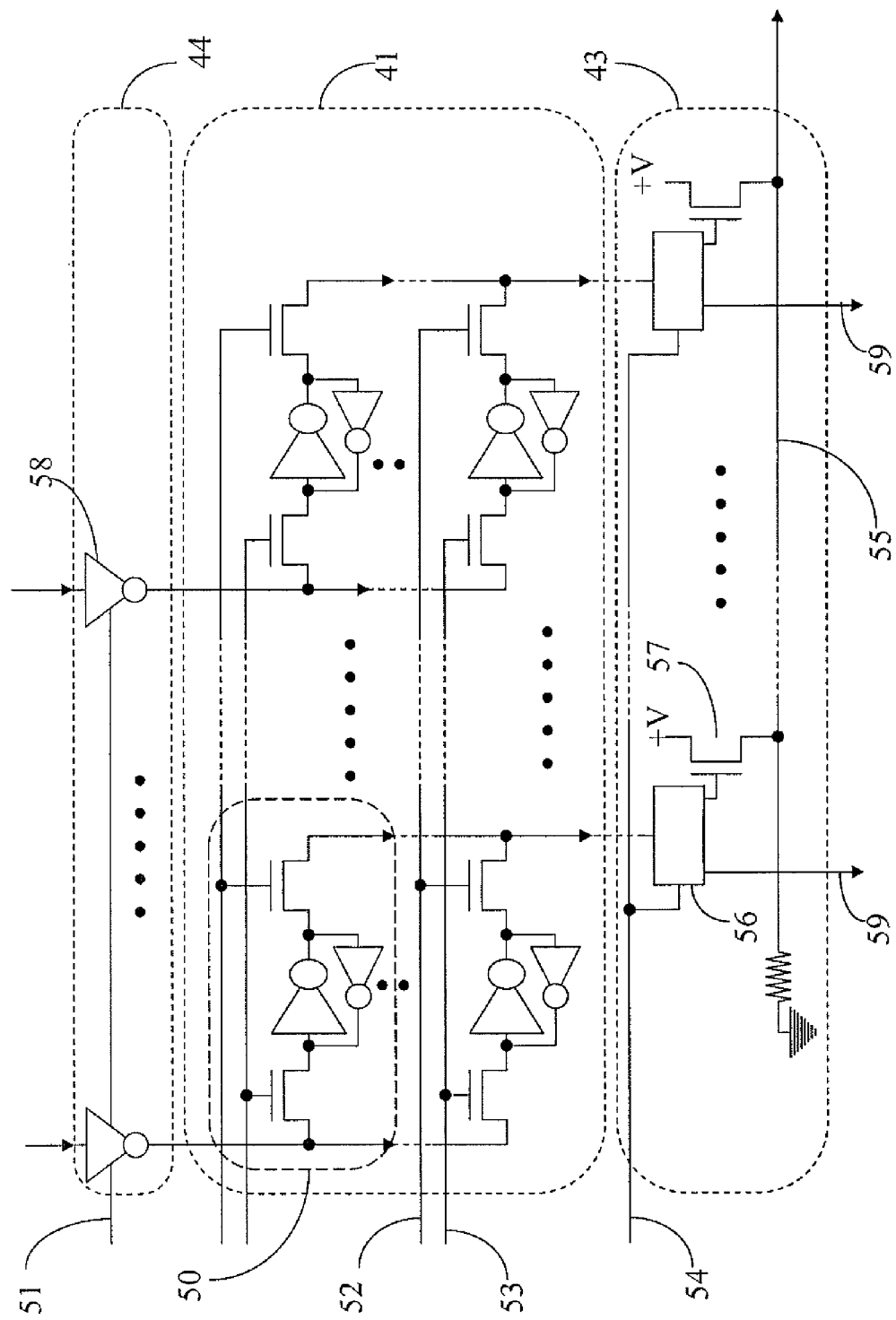
FIG. 5 is a detailed diagram of an embodiment of a memory.

Reference is now made to FIG. 5, a detailed diagram of an embodiment of a memory. The input drive logic 44 comprises tri-state inverters 58 shown being driven by the Read/write control line 51 to drive the inputted data signals into the memory core 41, where the signals may be gated into the memory cells 50 by one or more of the write word lines 53 to perform a write. To perform a read, the selected read word lines may be used to gate the inverted signal from the memory cells to the output logic 43, which may include a test input 54, which may drive each bit of output logic 56 that, in turn, may drive the selected signals onto the data outputs 59. The bit test output from each bit of output logic may drive a transistor 57, any one of which may pull the test output 55 high. During a normal read, the test output 55 may be pulled high if there is an invalid signal on any output. In test mode, the test output 55 may be pulled high if there is a fault on any output.

Figure 6:
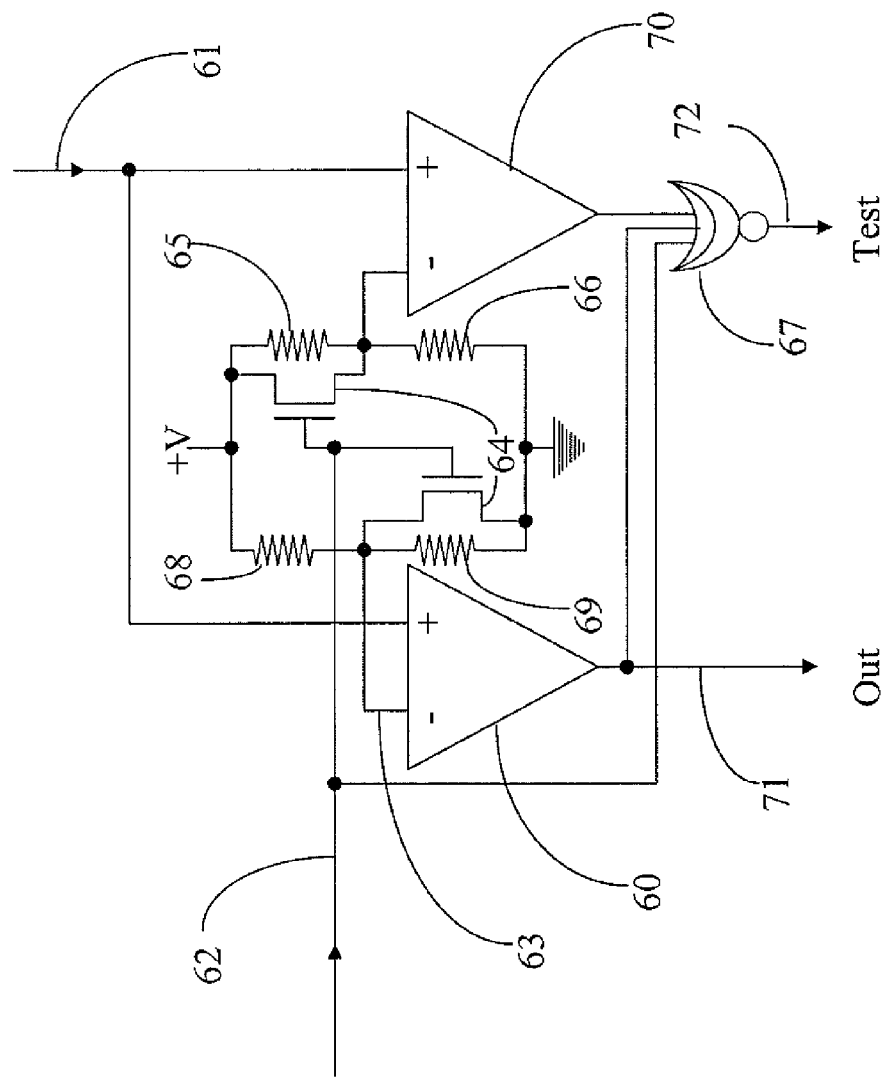
FIG. 6 is a diagram of a bit of output logic for a memory.

Reference is now made to FIG. 6, a diagram of a bit of output logic for a memory, according to an embodiment of the invention. The input from the memory core 61 may drive the input of two operational amplifiers 60, 70 that may rail to power or ground based on whether the voltage on the input 61 is above or below the reference voltage, which may be determined by the ratio of the two pairs of resistors 65, 66 and 68, 69, during normal operation. During normal operation, the ratio between the pair of resistors 68, 69 determines the reference voltage for the operational amplifier 60 that drives the output 71. Similarly, the ratio between the pair of resistors 65, 66, determines the reference voltage for the other operational amplifier 70. If these ratios are the same, the inputs to the XNOR 67 will always be the same, pulling its output low. If these ratios are different, the XNOR 67 will pull its output high when the input voltage 61 is between the two reference voltages. In this fashion, a bad bit, which produces neither a logic level 0 nor a logic level 1, may be detected.

During test mode, the transistors 64 may be turned on, which may thus change the ratios of the resistances, pulling the reference voltage for the first operational amplifier 60 lower and the reference voltage for the second operational amplifier 70 higher. If the input voltage 61 is between the two reference voltages, the XNOR 67 may then pull its output low, but if the input voltage is above or below the two reference voltages, the XNOR 67 may then pull its bit test output 72 high. In this fashion, when multiple words are read simultaneously, where half were written to a logic level 1 and half were written to a logic level 0, a bad bit may then produce a higher or lower than mid-range voltage, which may then be detected.

TABLE 4

| | Voltage | | |
|---|---|---|---|
| | Low | Mid | High |
| Test Mode | Fault | Ok | Fault |
| Normal Mode | Ok | Fault | Ok |

Reference is again made to FIG. 5. Table 4 above shows a logical map for test and normal modes. A fault may be detected on any one or more data outputs 59 when the test output 55 shown in FIG. 5 goes high during a read operation.

Unfortunately, if there are 2048 words in a 3-volt memory, where half are driving a logical 1 and half are driving a logical 0 on all outputs of a read of all word lines, then a one-bit error may result in less than 2 mV deviation from the mid-range for that output. This may be difficult to detect, given the process variation of the resistors and transistors. On the other hand, if only 8 words were selected and one was failing, the deviation could be as much as 375 mV. While this may be easily detectable, it requires reading in blocks of 8 words. Table 3 shows a single bit 0 rotated address, which selects the pairs of addresses 0 and 1, 4 and 5, 8 and 9, and 12 and 13 corresponding to the address xx0x. Further down in the table there is a rotation of a single bit 1 address, which selects pairs 2 and 3, 6 and 7, 10 and 11, and 14 and 15, corresponding to the address xx1x. Together the two writes and the two reads may be used to cover the entire checkerboard test as shown below:

It is also contemplated that multiple heterogeneous functional blocks may be enabled by a serial decoder in a manner similar to the memory described in this disclosure. Furthermore, these testing structures and techniques may be used by successively applying patterns and addressing sub-groups of these blocks, where half of the selected blocks have one state and the other half have the opposite state on a selected set of their outputs.

Figure 9:
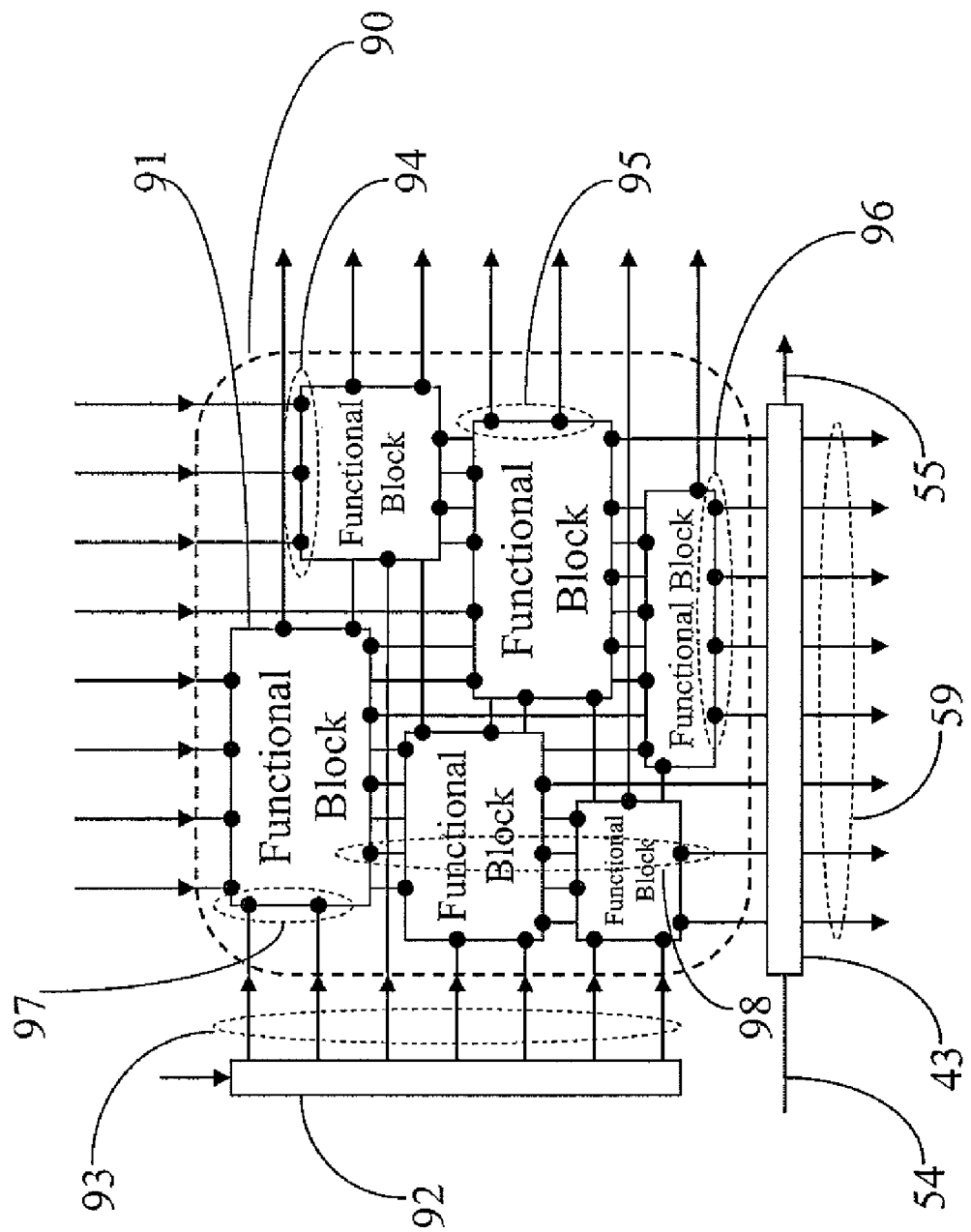
FIG. 9 is a diagram of a serial address decoded functional block test structure.

Reference is now made to FIG. 9, a diagram of a serial address decoded functional block test structure. Similar to the memory shown in FIG. 4, the test structure for the core 90 may comprise a serial decoder 92 and output logic 43. The serial decoder may be similar to the decoder shown in FIG. 1. One version of the output logic 43 can be seen in FIG. 5. The core 90 may include a plurality of functional blocks 91, each with a plurality of inputs 94 and one or more block test outputs 96, which may be connected 98 to block test outputs from one or more other functional blocks. The output logic 43 may have an optional data output 59 for each of the connected sets 98 of block test outputs, a test input 54, and a test output 55. The test output 55 may be used to indicate if a fault occurred on any of the sets of block test outputs 98, depending on the state of the test input 54. Each of the functional blocks' 91 block test outputs 96 may be enabled by one or more of the enable inputs 97 connected to one of the serial decoder 92 word lines 93. Each of the functional blocks 91 may also have one or more outputs 95 that may not be connected to the test structures. In normal mode, the serial decoder 92 may be

TABLE 5

| Address Operation | A | S | R | 0 | 1 | 2 | 3 | 4 | 5 | 6 | 7 | 8 | 9 | 10 | 11 | 12 | 13 | 14 | 15 | Memory Operation |
|---|---|---|---|---|---|---|---|---|---|---|---|---|---|---|---|---|---|---|---|---|
| Reset | x | 1 | x | 1 | 1 | 1 | 1 | 1 | 1 | 1 | 1 | 1 | 1 | 1 | 1 | 1 | 1 | 1 | 1 | Write 0101 ... |
| A: xxx0 | 0 | 0 | 1 | 1 | 0 | 1 | 0 | 1 | 0 | 1 | 0 | 1 | 0 | 1 | 0 | 1 | 0 | 1 | 0 | W/R 1010 ... |
| A: xx0x | 0 | 0 | 0 | 1 | 1 | 0 | 0 | 1 | 1 | 0 | 0 | 1 | 1 | 0 | 0 | 1 | 1 | 0 | 0 | read xxxxxx |
| Reset | x | 1 | x | 1 | 1 | 1 | 1 | 1 | 1 | 1 | 1 | 1 | 1 | 1 | 1 | 1 | 1 | 1 | 1 | — |
| A: xxx1 | 1 | 0 | 1 | 0 | 1 | 0 | 1 | 0 | 1 | 0 | 1 | 0 | 1 | 0 | 1 | 0 | 1 | 0 | 1 | — |
| A: xx1x | 0 | 0 | 0 | 0 | 0 | 1 | 1 | 0 | 0 | 1 | 1 | 0 | 0 | 1 | 1 | 0 | 0 | 1 | 1 | read xxxxxx |

As can be seen in Table 5 above, writing the entire memory with a checkerboard pattern may be accomplished in two writes. Then, given this technology, only two successive reads, two additional address cycles and another read may be needed to verify that this checkerboard pattern was correctly written into memory. Another round of the tests shown in Table 5, where the opposite bit values are written into the memory, may then sufficient to detect all single bit stuck and adjacent short conditions in the memory core. These techniques may similarly be used improve the performance of other memory tests, such as inverting ones, and testing the serial decoder. Furthermore, the test input 54, shown in FIG. 5 need not always be on during testing, nor does the test output 55 need to always signify a fault when set high. For example, the test input 54 need not be set when reading a single word, which may then be used to test for a proper normal value, or the test input 54 may be reset (put into normal mode) when reading pairs of words with the same values. Furthermore, the transistors 64 shown in FIG. 6 may not be needed if the difference between the reference voltages in normal mode is sufficient to ensure valid results when reading groups of words where half of the bits in any bit location are of opposite polarity to the other half of the bits.

disabled, which may disable all the functional blocks' 91 test outputs 96. In test mode, the serial decoder 91 may enable selected test outputs 96 from selected functional blocks 91. Since each functional block 91 may have a different number of enable inputs 97 than test outputs 96, each enable input 97 may enable none, one or many of the functional block test outputs 96. The test input 54 may be used to control what faults the test output 55 may detect. The optional data outputs 59 may be observed to further detect and isolate faults in the core.

It is further contemplated that that the output logic with the test structures presented above may be inserted between a memory core and subsequent select logic, which may then be used to select outputs of the memory from multiple outputs of the memory core.

Figure 7:
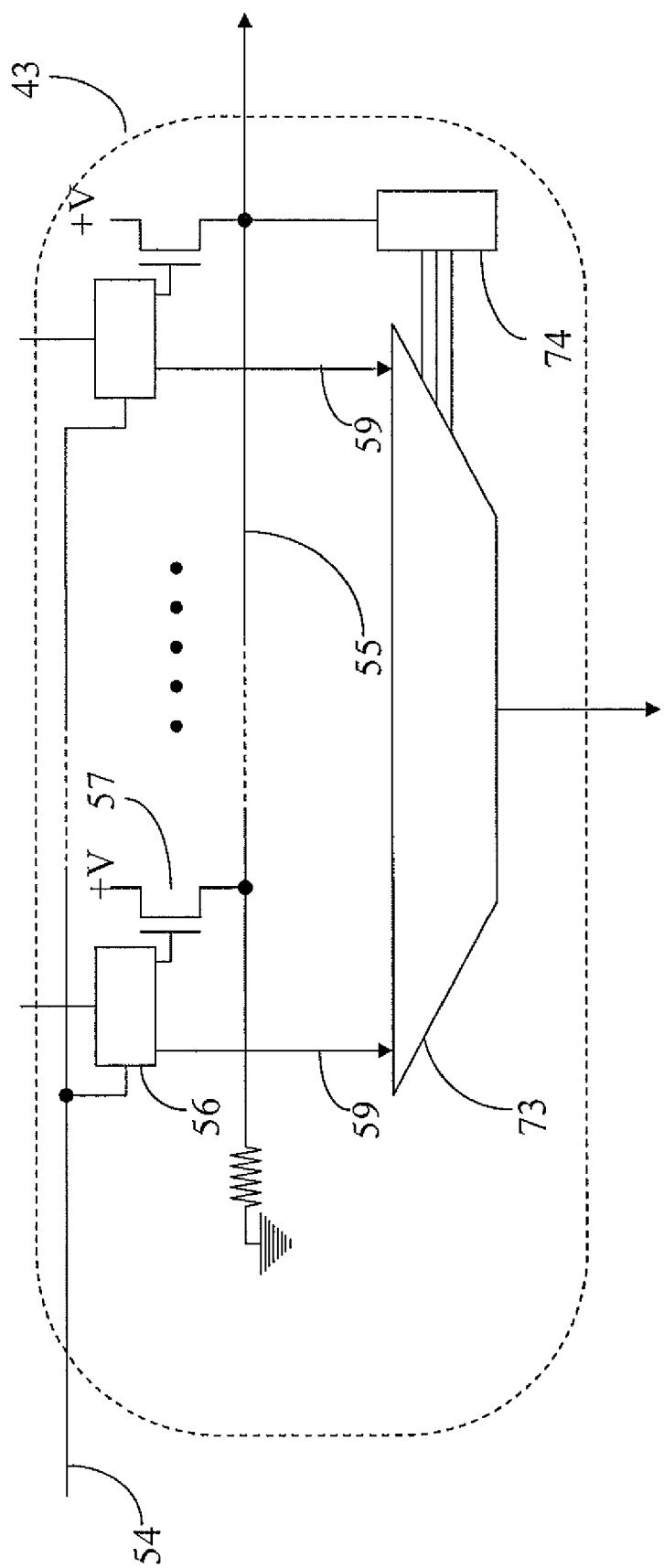
FIG. 7 is a diagram of output logic of a serially addressed memory.

Reference is again made to FIG. 4, a diagram of a serial address decoded memory. In another embodiment of the memory, the single output 46 may be used as a serial data output in normal mode, leaving the rest of the parallel outputs 45 unused. Furthermore, under certain conditions, this serial output may begin outputting the contents of the address being read prior to selecting the final address, Reference is now made to FIG. 7, a diagram of output logic 43 of an embodiment of a serially addressed memory with serial output capability. In this version, the serial address may be loaded, the memory address may be read, and when the contents of all the individual data outputs 59 are determined to be valid, the test output 55 may be pulled low, enabling the counter 74 to successively select the data outputs 59 through a multiplexor 73. Thereafter, the data may be serially outputted, one bit per clock cycle. A single read of a 16×4 bit memory may thus take at least ten clock cycles: one to reset the decoder and the counter, four to address the word in memory, one to read the word to its outputs, and four to individually select the four data outputs 59. Alternatively, since the validity of each of the outputs may be determined by its output logic 56, the data output 59 values may be predicted prior to selecting the final address, which may then allow the serial outputting to begin prior to completion of the address decoding.

Figure 8:
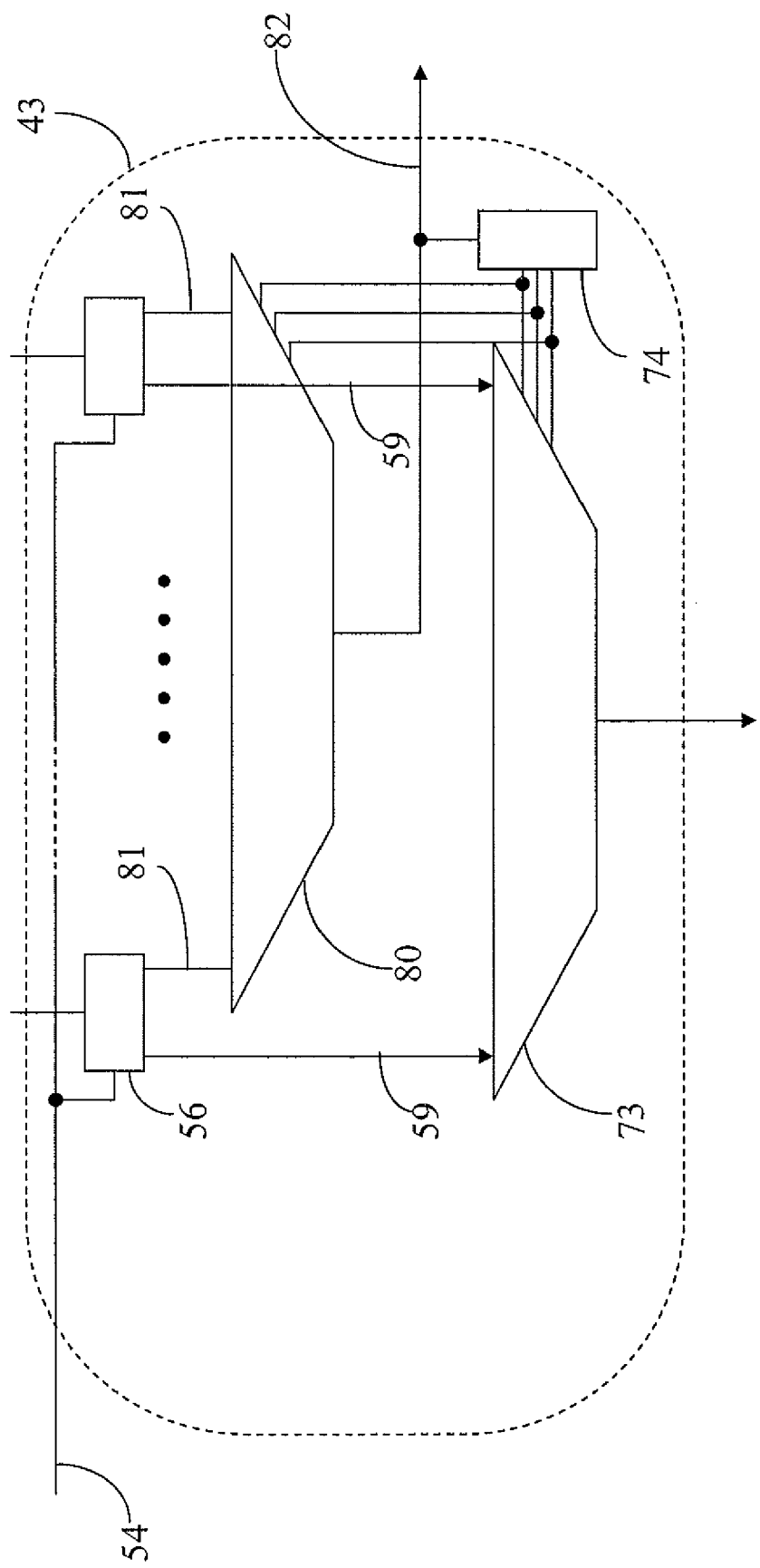
FIG. 8 is another diagram of output logic of a serially addressed memory.

Reference is now made to FIG. 8, a diagram of output logic 43 of an embodiment of a serially addressed memory with serial output capability and look-ahead. In this case, as in FIG. 7, the counter may be reset when the serial decoder is reset. As the read address is being decoded, individual data outputs 59 may become valid. When the first selected output becomes valid, the corresponding multiplexor 80 may select the corresponding bit test output 81 to drive the memory test output 82, which may then enable the counter to move to the next selected output. In this fashion the output values of a read may be serially extracted from the memory as they become valid, regardless of the state of the decode. The clock cycle when any particular output is valid may vary depending on the contents of the bits in the multiple words being currently selected by the serial decoder. As a result, any single output may remain selected until it becomes valid. These output values may generally be externally captured only when they become valid, which may generally correspond, in this embodiment, to the case when the memory test output 82 goes low. Still, if the contents of successive columns of bits in memory were all the same for the words selected by the decoder, a read of a 16×4 memory could take as few as five cycles: one cycle for resetting the decoder and counter, and four cycles for simultaneously decoding and serially reading out the outputs.

In some cases, it may not be desirable to wait for each bit to become valid, so in yet another embodiment of the present invention, it is also contemplated that the output logic could be constructed so as to wait until the number of valid successive high order bits equals or exceeds the number of clock cycles left in the serial address decoding, thus guaranteeing the ability to access all the valid bits of output on successive clock cycles.

It may also be desirable to determine the specific location of an actual failure in a memory, because statistically significantly repeating defects may represent a design or mask error, which when corrected can significantly improve the yield of the process. Isolation of such defects can traditionally require more testing than was required to determine if the part was good.

Therefore, in yet another embodiment of the present invention, partial address decoding and partially decoded address rotation of a serially address decoded digital memory may be used to efficiently isolate defects in the memory, by performing groups of memory writes and reads, each of which simultaneously selects multiple words in the memory.

For example, considering a 16 bit×16 word memory, such as that shown in FIG. 3, a fault may exist on one bit of the 16 bits of output. The fault may typically show up on one or two of the first three reads, as shown in Table 6 below. By performing the two additional reads shown in Table 6, each after rotating the address, the exact location of the failing bit in the memory may be determined by the pattern of passing and failing tests.

TABLE 6

| Address Operation | A | S | R | 0 | 1 | 2 | 3 | 4 | 5 | 6 | 7 | 8 | 9 | 10 | 11 | 12 | 13 | 14 | 15 | RW | P# |
|---|---|---|---|---|---|---|---|---|---|---|---|---|---|---|---|---|---|---|---|---|---|
| Reset | x | 1 | x | 1 | 1 | 1 | 1 | 1 | 1 | 1 | 1 | 1 | 1 | 1 | 1 | 1 | 1 | 1 | 1 | | 0 |
| A: xxx0 | 0 | 0 | 1 | 1 | 0 | 1 | 0 | 1 | 0 | 1 | 0 | 1 | 0 | 1 | 0 | 1 | 0 | 1 | 0 | R | 1 |
| A: xx0x | 0 | 0 | 0 | 1 | 1 | 0 | 0 | 1 | 1 | 0 | 0 | 1 | 1 | 0 | 0 | 1 | 1 | 0 | 0 | R | 2 |
| Reset | x | 1 | x | 1 | 1 | 1 | 1 | 1 | 1 | 1 | 1 | 1 | 1 | 1 | 1 | 1 | 1 | 1 | 1 | | 3 |
| A: xxx1 | 1 | 0 | 1 | 0 | 1 | 0 | 1 | 0 | 1 | 0 | 1 | 0 | 1 | 0 | 1 | 0 | 1 | 0 | 1 | | 4 |
| A: xx1x | 0 | 0 | 0 | 0 | 0 | 1 | 1 | 0 | 0 | 1 | 1 | 0 | 0 | 1 | 1 | 0 | 0 | 1 | 1 | R | 5 |
| A: x1xx | 0 | 0 | 0 | 0 | 0 | 0 | 0 | 1 | 1 | 1 | 1 | 0 | 0 | 0 | 0 | 1 | 1 | 1 | 1 | R | 6 |
| A: 1xxx | 0 | 0 | 0 | 0 | 0 | 0 | 0 | 0 | 0 | 0 | 0 | 1 | 1 | 1 | 1 | 1 | 1 | 1 | 1 | R | 7 |

If the reads in tests 1, 2 and 5 (denoted by the "P#" in the last column of Table 6) of the regular checkerboard test, duplicated in Table 6 from Table 5, form some combinations of good tests and faulty tests, there may be more than one single failing bit in the memory. Otherwise, the rest of the tests where some are good and some are faulty may generally indicate that a single fault is the cause. In those cases, tests 6 and 7 may be used to reduce the possible addresses to one based on whether these tests are faulty. The fault dictionary in Table 7, below, shows the failing address corresponding to which tests are faulty. The good tests are denoted by a G, and faulty tests are denoted by an F. The first column of the table lists the test number, and the last row contains the address of a fault corresponding to the pattern of good and faulty test results found in the particular column above it, starting with the second column.

TABLE 7

| 1 | G | G | G | G | G | G | G | F | F | F | F | F | F | F | F |
|---|---|---|---|---|---|---|---|---|---|---|---|---|---|---|---|
| 2 | F | F | F | F | G | G | G | G | F | F | F | F | G | G | G | G |
| 5 | G | G | G | G | F | F | F | F | G | G | G | G | F | F | F | F |
| 6 | F | F | G | G | F | F | G | G | F | F | G | G | F | F | G | G |
| 7 | F | G | F | G | F | G | F | G | F | G | F | G | F | G | F | G |
| Addr | 12 | 4 | 8 | 0 | 15 | 7 | 11 | 3 | 12 | 4 | 8 | 0 | 14 | 6 | 10 | 2 |

It will be appreciated by persons skilled in the art that the present invention is not limited by what has been particularly shown and described hereinabove. Rather the scope of the present invention includes both combinations and sub-combinations of various features described hereinabove as well as modifications and variations which would occur to persons skilled in the art upon reading the foregoing description and which are not in the prior art.

I claim:

1. A method of testing a memory, said memory addressed using a serial decoder, said method comprising:
   (a) simultaneously writing into all of the words in said memory;
   (b) simultaneously writing into half of said words in said memory;
   (c) simultaneously reading half of said words in said memory; and
   (d) simultaneously reading the words in said memory not read in (c).

2. The method as in claim 1, wherein in (b), said half of said words in said memory correspond to either the even words in said memory or to the odd words in said memory.

3. The method as in claim 1, wherein half of said half of said words in said memory read in (c) are not in the set of said half of said words in said memory written in (b).

4. The method as in claim 1, wherein:
   said words in (a) are selected by resetting said serial decoder;
   said words in (b) are selected by partial addressing of said serial decoder;
   said words in (c) are selected by rotating a decoded address within said serial decoder; and
   said words in (d) are selected by resetting, partially addressing, and rotating a decoded address within said serial decoder.

5. The method as in claim 1, wherein at least one said simultaneously reading includes simultaneously determining if voltage levels of all outputs of the words in said memory that are to be read are between two reference voltages.

6. The method as in claim 5, wherein said two reference voltages are determined by a state of a test input.

7. A method of isolating a single fault in a memory addressed using a serial decoder, said method comprising:
   i) testing said memory, said testing method further comprising:
      (a) simultaneously writing into all of the words in said memory,
      (b) simultaneously writing into half of said words in said memory,
      (c) selecting another half of said words in said memory,
      (d) simultaneously reading said selected words from said memory, and
      (e) repeating steps (c) and (d) until all words in said memory have been read;
   ii) collecting faulty and good results from said testing said memory;
   iii) finding results that match said faulty and good results in a fault dictionary; and
   iv) retrieving the single fault address.

8. A semiconductor component comprising:
   one or more devices;
   at least one test input; and
   at least one test output;
   wherein, in a first mode of said test input, said test output indicates if the voltage on a data input to the semiconductor component is between a first pair of predefined voltage limits, and in a second mode of said test input, said test output indicates if the voltage on said data input is not between a second pair of predefined voltage limits.

9. The semiconductor component as in claim 8, wherein said first mode is a normal mode, wherein in the normal mode, said test output indicates a fault if said voltage on said data input to the semiconductor component is between said first pair of predefined voltage limits; and wherein said second mode is a test mode, wherein in the test mode, said test output indicates a fault if said voltage on said data input is not between said second pair of predefined voltage limits.

10. The semiconductor component as in claim 8, wherein said first pair of predefined voltage limits equal said second pair of predefined voltage limits.

11. A structure for testing a plurality of functional blocks within an integrated circuit, said functional blocks comprising at least one enable input and at least one block test output, said test structure comprising:
   output logic with a test output and a plurality of inputs coupled to at least one block test output of at least one of said functional blocks; and
   a serial decoder with one or more word lines coupled to one or more of said enable inputs of said functional blocks;
   wherein each of said block test outputs is to be enabled by at least one of said word lines.

12. The structure as in claim 11, wherein said output logic is to translate values on said plurality of inputs to a fault indication on said test output of said output logic.

13. The structure as in claim 12, wherein said output logic is to translate values on each of said plurality of inputs to each of a plurality of data outputs.

14. The structure as in claim 11, wherein said output logic is to translate values on each of said plurality of inputs to each of a plurality of data outputs.

* * * * *